US009859823B2

(12) United States Patent
Roesner

(10) Patent No.: US 9,859,823 B2
(45) Date of Patent: Jan. 2, 2018

(54) METHOD FOR ASCERTAINING THE PHASE CURRENTS OF AN ELECTRIC MACHINE HAVING A POWER CONVERTER

(71) Applicant: Robert Bosch GmbH, Stuttgart (DE)

(72) Inventor: Julian Roesner, Untergruppenbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/428,583

(22) PCT Filed: Sep. 4, 2013

(86) PCT No.: PCT/EP2013/068216
§ 371 (c)(1),
(2) Date: Mar. 16, 2015

(87) PCT Pub. No.: WO2014/044526
PCT Pub. Date: Mar. 27, 2014

(65) Prior Publication Data
US 2015/0270797 A1    Sep. 24, 2015

(30) Foreign Application Priority Data

Sep. 24, 2012   (DE) .......................... 10 2012 217 116

(51) Int. Cl.
*G05B 11/28*     (2006.01)
*H02P 6/12*      (2006.01)
(Continued)

(52) U.S. Cl.
CPC ............... *H02P 6/12* (2013.01); *G01R 25/00* (2013.01); *H02P 25/22* (2013.01); *G01R 19/0092* (2013.01); *H02M 2001/0009* (2013.01)

(58) Field of Classification Search
CPC .......................... H02O 21/141; H02M 7/53875
(Continued)

(56) References Cited

U.S. PATENT DOCUMENTS 5,194,796 A     3/1993  Domeki et al.
6,072,287 A *   6/2000  Gataric ................. B60L 11/123
                                                318/34

(Continued)

FOREIGN PATENT DOCUMENTS

CN          1389737 A        1/2003
DE     10 2009 001543        9/2010
(Continued)

OTHER PUBLICATIONS

International Search Report for PCT/EP2013/068216, dated May 8, 2014.

*Primary Examiner* — Rina Duda
(74) *Attorney, Agent, or Firm* — Norton Rose Fulbright US LLP; Gerard Messina

(57) ABSTRACT

In a method for ascertaining the phase currents of an electric machine having a power converter and a stator with a phase number of four or more, the phase currents of a measuring number of measuring phases is measured, which is at least two and is lower by at least two than the phase number, and the phase currents of the remaining phases are arithmetically determined from the measured phase currents, at least the measured phase currents, a spatial angle of the measuring phases and a spatial angle of the remaining phases being used for the arithmetical determination.

9 Claims, 2 Drawing Sheets

(51) Int. Cl.
  *H02P 25/22* (2006.01)
  *G01R 25/00* (2006.01)
  *G01R 19/00* (2006.01)
  *H02M 1/00* (2006.01)

(58) Field of Classification Search
  USPC .................. 318/432, 434, 727, 800, 801
  See application file for complete search history.

(56) References Cited

U.S. PATENT DOCUMENTS

| | | | | |
|---|---|---|---|---|
| 6,400,116 | B1 * | 6/2002 | Chen | H02P 6/006 |
| | | | | 318/139 |
| 6,469,858 | B1 * | 10/2002 | Tsuyuguchi | G11B 19/20 |
| | | | | 360/272 |
| 6,803,740 | B2 * | 10/2004 | Mir | H02P 25/085 |
| | | | | 318/608 |
| 7,372,712 | B2 * | 5/2008 | Stancu | H02M 1/32 |
| | | | | 363/71 |
| 8,605,461 | B2 | 12/2013 | Hibino | |
| 2005/0062452 | A1 * | 3/2005 | Mir | H02P 25/085 |
| | | | | 318/701 |
| 2007/0262759 | A1 | 11/2007 | Burton et al. | |
| 2008/0150515 | A1 * | 6/2008 | Ollila | H02M 5/4585 |
| | | | | 324/85 |
| 2009/0237015 | A1 * | 9/2009 | Hashimoto | H02P 29/026 |
| | | | | 318/400.02 |

FOREIGN PATENT DOCUMENTS

| | | |
|---|---|---|
| DE | 10 2009 027028 | 12/2010 |
| EP | 226 48 88 | 12/2010 |
| EP | 2 348 630 | 7/2011 |
| EP | 23 60 483 | 8/2011 |
| JP | 0 345 196 | 2/1991 |

* cited by examiner

METHOD FOR ASCERTAINING THE PHASE CURRENTS OF AN ELECTRIC MACHINE HAVING A POWER CONVERTER

BACKGROUND OF THE INVENTION

1. Field of the Invention

The present invention relates to a method for ascertaining the phase currents of an electric machine having a power converter as well as an arithmetic unit for carrying out the method.

2. Description of the Related Art

Generators for converting mechanical energy into electrical energy are known. In motor vehicles, claw pole generators are generally used. These may be equipped with electrical excitation. Since claw pole generators generate polyphase current, a rectification is necessary for the DC voltage vehicle electrical systems customarily used in motor vehicles. For this purpose, rectifiers having semiconductor diodes and/or active switching elements may be used.

Generators, which are also used for the vehicle drive, are known from the field of hybrid vehicles. These are to support the internal combustion engine in particular when it does not (yet) supply its full torque (boost operation, turbo lag compensation.) Motorized generators including their associated inverters are also referred to as electric drives within the scope of this application.

The regulation of an electric drive may be carried out with the aid of a field-oriented regulation in which the phase currents (i.e., currents through the phases or stator winding phases) of the machine are ascertained and regulated to a setpoint value. Usually two phase currents are measured in three-phase machines; the third phase current may be ascertained arithmetically, since the sum of all phase currents is zero.

Accordingly, in drives having more than three phases, N−1 phase currents must be measured, N being the phase number of the drive.

For the field-oriented regulation, the measured phase currents are transformed into a rotating-field-fixed dq coordinate system. It is not the individual phase currents which are important for the regulation, but rather the calculated current vector in the dq coordinate system. However, all phase currents must be known or at least arithmetically ascertainable.

The measurement of the phase currents may be carried out via measuring resistors, so-called shunts. Generally, these shunts are not directly installed in the phases of the drive, but in a low-side path of the power converter. For this reason, a measurement is only possible at points in time at which the phase current to be measured is negative, since only then are the diodes or active switching elements situated in the low-side path of the power converter conductive. For this reason, as a function of the activation (in particular PWM or block operation) of the power converter, only few fixedly defined points in time exist at which a current measurement may be carried out. This is not satisfactory.

The provision of measuring resistors having the required measuring electronics is moreover complex, so that simplified devices and methods for ascertaining the phase currents are desirable. In particular there is a need for such simplified devices and methods which may be used during PWM operation as well as during block operation.

BRIEF SUMMARY OF THE INVENTION

According to the present invention a method for ascertaining the phase currents of an electric machine having a power converter and a phase number of at least four, as well as an arithmetic unit for carrying out the method, is provided.

The method according to the present invention includes measuring the phase currents of a number of measuring phases, which is at least two and is lower by at least two than the phase number of the electric machine, and to then arithmetically determine the phase currents of the remaining phases from the phase currents measured regarding the measuring phases. The measuring effort may thus be significantly reduced and/or the time periods at which a measurement can take place may be increased. For the arithmetic determination, in particular the measured phase currents in absolute value and phase position, as well as the spatial angle of the individual stator winding phases or the spatial angular offset of the individual stator winding phases toward one another, are used.

Within the scope of the present patent application, the "phase number" refers to the total number of phases (stator winding phases) of the electric machine. In an electric machine including five stator winding phases, the number is therefore five. Within the scope of the present invention "measuring phases" refer to those phases of the electric machine whose phase currents are actually measured via corresponding measuring devices, for example, measuring resistors. The measuring phases do not necessarily have to be established; the respective phases may also be those which are measurable within a certain switching state. However, they have measuring devices suitable either individually or in pairs, for example.

The phase currents of the "remaining phases" are not measured, at least in the measuring cycle or switching cycle monitored in each case. The phase number results from the addition of the number of the measuring phases and the number of the remaining phases.

As explained at the outset, in conventional methods for electric machines having more than three phases, N−1 phase currents must be measured, i.e., the number of the measuring phases is N−1 and the number of the remaining phases is 1. According to the present invention, however, it is sufficient for the ascertainment of all phase currents in the simplest case to measure the phase currents of only two measuring phases; the phase currents of the remaining phases may be determined arithmetically from there.

The present invention is intended for electric machines having a phase number of four and higher, and is suitable in particular for such electric machines. The present invention is suitable in particular for electric machines having power converters which are used in so-called boost recuperation systems in motor vehicles.

The method according to the present invention may be supplemented with a selection which is advantageous for the measurement and the analysis of the respective phases to be measured, as well as of the current measurement points in time as a function of the respectively selected activation pattern. The present invention may also include a measurement of corresponding phase currents in one shared line, to which multiple phases are connected, so that the analysis is considerably simpler than in the related art. At the same time, a valid current vector in the dq coordinate system may be ascertained at a great number of points in time by using the provided measures both during PWM activation as well as during block activation.

One significant advantage of the present invention is thus in particular a saving of current measuring devices in the drive and thus a reduction of the overall size and the manufacturing costs on the one hand, and an expansion of possible measuring points in time on the other hand.

An arithmetic unit according to the present invention, e.g., a charging control unit of a motor vehicle, is configured, in particular from a programming point of view, to carry out a method according to the present invention.

The implementation of the method in the form of software is also advantageous, since it entails very low costs, in particular when an executing control unit is also used for other tasks and is therefore present anyway. Suitable data media for providing the computer program are, in particular, diskettes, hard drives, flash memories, EEPROMs, CD-ROMs, DVDs, etc. A download of a program via computer networks (Internet, Intranet, etc.) is also possible.

Additional advantages and embodiments of the present invention arise from the description and the accompanying drawing.

It is understood that the features stated above and the features still to be explained below are usable not only in the particular combination specified but also in other combinations or alone without departing from the scope of the present invention.

The present invention is represented schematically in the drawings based on one exemplary embodiment/on exemplary embodiments and is described in greater detail below with reference to the drawings.

DETAILED DESCRIPTION OF THE INVENTION

Figure 1:
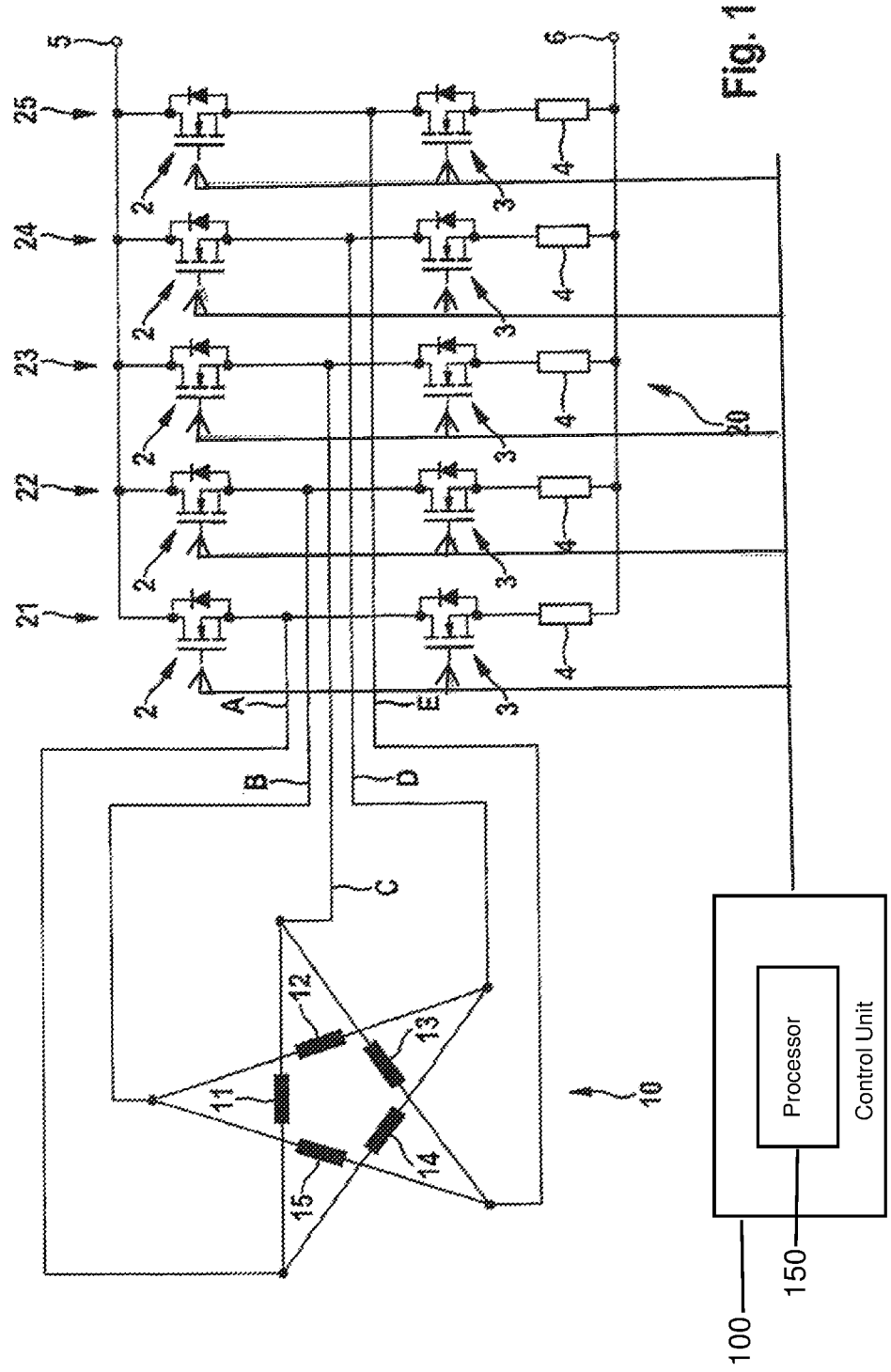
FIG. 1 shows, in a schematic representation, an electric machine having a power converter such as the one on which the present invention may be based.

FIG. 1 shows a highly simplified representation of the elements, which are essential to illustrate the present invention, of an electric machine having a power converter as it may be part of a vehicle electrical system. Included herein is a five-phase stator 10. Five-phase stator 10 has a total of five stator winding phases (also known as stator windings) 11 through 15. A rotor is not shown for the sake of clarity.

Five-phase stator 10 is connected with its five stator winding phases 11 through 15 to a power converter 2, which includes five converter bridges 21 through 25 including active switching elements 2, 3, for example, MOSFETs. The five stator winding phases 11 through 15, or the five converter bridges 21 through 25, define the five phases A through E of the electric machine. Power converter 2 may be operated as a rectifier (usually when the electric machine is operated in generator mode to power the vehicle electrical system) or as an inverter (usually when the electric machine is operated as a motor.)

Active switching elements 2, 3 are connected via busbars to stator winding phases 11 through 15 on the one hand, and to direct voltage terminals 5, 6 on the other hand. Direct voltage terminals 5, 6 may be connected to a power storage device in a vehicle electric system, for example, a battery. In this configuration, direct voltage terminal 5 is connected to the positive battery terminal, and direct voltage terminal 6 is connected to the negative battery terminal or chassis. Active switching elements 2 are thus positioned in the so-called upper rectifier branch, and active switching elements 3 are positioned in the lower rectifier branch. Thus, active switching elements 2 are so-called high-side switching elements, and active switching elements 3 are so-called low-side switching elements. This is also referred to as a high-side path (from the center of the respective converter bridges 21 through 25 via switching elements 2 to direct voltage terminal 5) or as a low-side path (from the center of the respective converter bridges 21 through 25 via switching elements 3 to direct voltage terminal 6.)

A current measurement is usually carried out via measuring resistors (shunts) 4 in the low-side paths of power converter 20. Naturally, however, the phase currents may only be measured at this point when the associated low-side switching element 3 is switched on. This, however, is only the case when the corresponding phase current is negative. A control unit 100 containing a processor 150 is connected to switching elements 2 and 3.

As explained above, a number of disadvantages result from a conventional current measurement. These may be overcome according to the present invention, the present invention being explained in greater detail in the following with reference to the PWM operation and the block operation.

Figure 2:
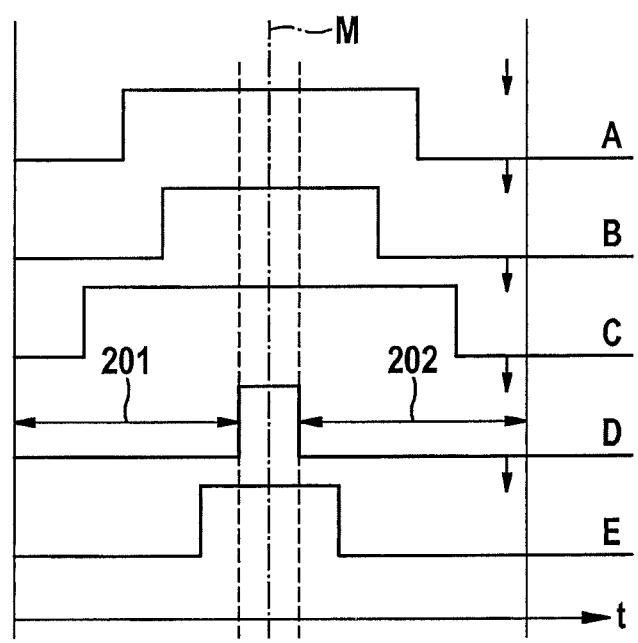
FIG. 2 shows, in a schematic representation, a PWM activation pattern for an electric machine having a power converter according to FIG. 1.

FIG. 2 shows a PWM activation pattern according to a so-called Center Aligned Method. The method according to the present invention may, however, also be used in other PWM methods, e.g., the so-called Edge Aligned Method. Here, FIG. 2 shows the switching state of the high-side switching elements (see switching elements 2 of FIG. 1) in the corresponding phases A through E of a five-phase electric machine over a time t. The corresponding low-side switching elements (e.g., switching elements 3) are activated in an exactly inverted manner thereto. FIG. 2 shows an activation within an activation period. The block widths of the individual phases are decisive for the level of the phase current to be provided.

In the Center Aligned Method, the activation blocks are positioned symmetrically to the center line M. The activation pattern repeats itself at a constant frequency, the activation widths being modified as a function of the rotation angle. The frequency is usually within a range of, for example, 16 kHz and is selected in such a way that, on the one hand, noises resulting therefrom are above the audible frequency range, and that on the other hand, the losses arising during switching of the MOSFETs are preferably small.

Customarily, a current measurement is carried out at a point in time at which all low-side switching elements are switched on (and the high-side switching elements are thus switched off), i.e., at the beginning or at the end of an activation window, as is shown in FIG. 2 using arrows. At best, the phase currents of all phases A through E may still be ascertained when the phase currents of N−1 phases are measurable. If, however, as it may be provided according to the present invention, only three or only two phase currents are measured, the measurement may be carried out at any point in time at which the low-side switching elements are closed in the respective branches to be measured, i.e., in the measuring phases. With regard to two phases, this is the case in the activation pattern shown in FIG. 2 in time periods 201 and 202. In these time periods, at least the low-side switching elements are always switched on in phases D and E, so that their phase currents may be measured.

A measurement may thus be carried out a lot more frequently and therefore depicts the actual circumstances much more accurately. In particular the field-oriented regulation may be carried out more rapidly in this way with a better regulation quality.

The use of only two measuring resistors in five-phase electric machines for the ascertainment of all phase currents is explained below. The principles explained here may be transferred by those skilled in the art to four-phase or polyphase machines, as also specified.

When a sinusoidal current progression $I(\phi)=I_0 \times \sin \phi$ is assumed, all missing phase currents may be calculated from two phase currents.

For the calculation of a phase current value $I_k(\phi_0)$ of a phase k from known (measured) current values $I_l(\phi_0)$, $I_m(\phi_0$ of phase l or m, the following applies:

$$I_k(\varphi_0) = \frac{I_l(\varphi_0) - I_m(\varphi_0) \cdot \frac{\sin\varphi_{kl}}{\sin\varphi_{km}}}{\cos\delta_{kl} - \frac{\sin\delta_{kl}}{\tan\delta_{km}}}$$

The calculation is advantageously carried out discretely, and is therefore called upon at a certain cycle time. The instantaneous phase currents are then calculated once per cycle.

Here, $\delta_{kl}$ refers to the spatial angular offset between phase k and phase l. The spatial angular offset between two adjacent phases is 360°/N in the case of a typical symmetric structure of the stator of the electric machine.

If, for example, in N=6 phases the phase currents of phase 3 and 5 ($I_3$ and $I_5$) are measured, l=3, m=5 and N=6 applies. Therefore, $\delta_{13}=180°$ and $\delta_{15}=300°$ applies.

If, for example, in a five-phase system including phases A through E, the phase current of phase A ($I_A$) is to be calculated from phase currents of phases B and C ($I_B$ and $I_C$), the spatial angular offset is $\delta_{AB}=360°/5=72°$ and the spatial angular offset is $\delta_{AC}=2\times 360°/5=144°$.

The phase currents of the remaining phases ($I_D$ and $I_E$) may be calculated from $I_B$ and $I_C$ by using the respective difference angles.

The present invention is also suitable in a particular manner for the current measurement in the so-called block operation. Above a certain speed, the so-called rated speed, the electric machine reaches the so-called voltage limit. There, the generated synchronous internal voltage is higher than the voltage present at the phases. In order for the machine to generate a motor-driven torque above this speed it is operated in the so-called field-weakening operation. Since this operation mode, however, has a low efficiency, the rated speed should be preferably high, which may be achieved, for example, with a higher phase voltage. For this reason, corresponding machines are activated in the field-weakening range during the block operation instead of the previously explained PWM operation, since, during the block operation, a higher, effective voltage may be generated at the stator winding than during a PWM activation.

In contrast to the PWM activation, no fixed activation frequency is used during the block operation; instead, the switching elements are switched in blocks on and off synchronously to the electrical angular velocity of the electric machine. Depending on the phase number, different block widths may be implemented. The activation type which generates the highest effective phase voltage is the so-called 180° block commutation, during which per phase during one electrical revolution the high-side and the low-side switching elements (see FIG. 1) are respectively switched on for an electrical angle of 180°.

In the following Table 1, the activation pattern in a 180° block commutation is shown for a five-phase electrical machine. Within one electrical rotation, 10 different activation patterns result here, which are always switched over after an electrical angle of 36°. A switched-on high-side switching element is referred to as 1; 0 refers to a switched-on low-side switching element.

TABLE 1

| φ | A | B | C | D | E |
|---|---|---|---|---|---|
| 0° | 0 | 0 | 0 | 1 | 1 |
| 36° | 0 | 0 | 1 | 1 | 1 |
| 72° | 0 | 0 | 1 | 1 | 0 |
| 108° | 0 | 1 | 1 | 1 | 0 |
| 144° | 0 | 1 | 1 | 0 | 0 |
| 180° | 1 | 1 | 1 | 0 | 0 |
| 216° | 1 | 1 | 0 | 0 | 0 |
| 252° | 1 | 1 | 0 | 0 | 1 |
| 288° | 1 | 0 | 0 | 0 | 1 |
| 324° | 1 | 0 | 0 | 1 | 1 |

In contrast to the PWM activation it stands out that at no point in time are all (or at least all except one) low-side switching elements switched on at the same time. For a purely metrological ascertainment of the phase currents, such an activation, also referred to as a switching vector, would have to be brought about for measuring purposes by temporarily switching on all (or all but one) low-side switching elements at defined points in time. The disadvantage here is, however, that the generated torque is reduced.

From the above table it is, however, also discernible that at least two low-side switching elements are switched on at any point in time. The present invention advantageously provides to always measure those phase currents which are presently available, for example:

0°-71°: Phases A and B
72°-143°: Phases A and E
144°-215°: Phases D and E
216°-287°: Phases C and D
288°-359°: Phases B and C If the number of the measuring resistors is to be reduced, this results in angular ranges in which no current is measurable, since only low-side switching elements are closed in those phases to which no measuring resistors are assigned. Since the block operation is only used at high speeds, those time periods are possibly small enough so that calculations may be carried out using the phase currents ascertained last.

Due to a metrologically advantageous placement of the measuring resistors, i.e., the current measuring points, the number of the angular segments without current measurement may be minimized. In the following Table 2, the case of an electric machine having five phases and a power converter is shown, which corresponds to, for example, the arrangement shown in FIG. 1. However, only three measuring resistors are provided here in phases A, B and C.

The switching states of the switching elements, as explained regarding Table 1, are shown in the left part of the table, a specification of the spatial angle of the associated phases being omitted. The right part of the table shows how the individual phase currents are ascertained. Here, the letter M means that the corresponding phase currents are measured; the letters A through E indicate from which phase currents the phase currents specified in the header are arithmetically determined (for example, first line: $I_A$, $I_B$ and $I_C$ are measured; $I_D$ and $I_E$ are arithmetically determined from $I_A$ and $I_C$.)

TABLE 2

| A | B | C | D | E | $I_A$ | $I_B$ | $I_C$ | $I_D$ | $I_E$ |
|---|---|---|---|---|---|---|---|---|---|
| 0 | 0 | 0 | 1 | 1 | M | M | M | A, C | A, C |
| 0 | 0 | 1 | 1 | 1 | M | M | A, B | A, B | A, B |
| 0 | 0 | 1 | 1 | 0 | M | M | A, B | A, B | A, B |
| 0 | 1 | 1 | 1 | 0 | M | — | — | — | — |
| 0 | 1 | 1 | 0 | 0 | M | — | — | — | — |
| 1 | 1 | 1 | 0 | 0 | — | — | — | — | — |
| 1 | 1 | 0 | 0 | 0 | — | — | M | — | — |
| 1 | 1 | 0 | 0 | 1 | — | — | M | — | — |
| 1 | 0 | 0 | 0 | 1 | B, C | M | M | B, C | M |
| 1 | 0 | 0 | 1 | 1 | B, C | M | M | B, C | M |

It is apparent that in this case only in five of the ten angular segments (corresponding to lines 1, 2, 3, 9 and 10 in the table) a measurement of the phase currents of two phases, and thus an ascertainment of the phase currents of all phases, is possible, since the low-side switching element is only closed in those two in phases A, B and C. In all other angular segments, only one or no phase current may be measured, so that the remaining phase currents may not be ascertained.

In contrast, in the arrangement on which the following Table 3 is based, which, in general, also corresponds to that of FIG. 1 and corresponds to Table 2 in the diagram, two measuring resistors are present in one shared feed line of phases A and D as well as in C and E, as well as one additional measuring resistor in Phase B. It is apparent that in this case the phase currents of all phases may be ascertained in eight of ten angular segments.

TABLE 3

| A | B | C | D | E | $I_A$ | $I_B$ | $I_C$ | $I_D$ | $I_E$ |
|---|---|---|---|---|---|---|---|---|---|
| 0 | 0 | 0 | 1 | 1 | M | M | M | AC | AC |
| 0 | 0 | 1 | 1 | 1 | M | M | AB | AB | AB |
| 0 | 0 | 1 | 1 | 0 | M | M | AE | AE | M |
| 0 | 1 | 1 | 1 | 0 | M | AE | AE | AE | M |
| 0 | 1 | 1 | 0 | 0 | — | — | — | — | M |
| 1 | 1 | 1 | 0 | 0 | DE | DE | DE | M | M |
| 1 | 1 | 0 | 0 | 0 | — | — | — | M | — |
| 1 | 1 | 0 | 0 | 1 | CD | CD | M | M | CD |
| 1 | 0 | 0 | 0 | 1 | CD | M | M | M | CD |
| 1 | 0 | 0 | 1 | 1 | BC | M | M | BC | BC |

The phase currents of all phases may only not be calculated if the low-side switching elements in phases A and D as well as C and E are switched on simultaneously, since in this case their individual phase currents may not be measured.

In the arrangement, on which the following Table 4 is based, two measuring resistors are provided in phases A and B. The arrangement generally corresponds to that of FIG. 1, the diagram to Tables 2 and 3. It is apparent that a current measurement is only possible in this case in the first three of the ten angular segments, since the low-side switching elements of phases A and B are closed only here. In all other angular segments, only one or no phase current may be measured, so that the phase currents of the other phases may not be ascertained.

TABLE 4

| A | B | C | D | E | $I_A$ | $I_B$ | $I_C$ | $I_D$ | $I_E$ |
|---|---|---|---|---|---|---|---|---|---|
| 0 | 0 | 0 | 1 | 1 | M | M | A, B | A, B | A, B |
| 0 | 0 | 1 | 1 | 1 | M | M | A, B | A, B | A, B |
| 0 | 0 | 1 | 1 | 0 | M | M | A, B | A, B | A, B |
| 0 | 1 | 1 | 1 | 0 | M | — | — | — | — |
| 0 | 1 | 1 | 0 | 0 | M | — | — | — | — |
| 1 | 1 | 1 | 0 | 0 | — | — | — | — | — |
| 1 | 1 | 0 | 0 | 0 | — | — | — | — | — |
| 1 | 1 | 0 | 0 | 1 | — | — | — | — | — |
| 1 | 0 | 0 | 0 | 1 | — | M | — | — | — |
| 1 | 0 | 0 | 1 | 1 | — | M | — | — | — |

In contrast, in the arrangement on which the following Table 5 is based, two current sensors are present in one shared feed line of phases A and D as well as in C and E. In this case, all phase currents may be ascertained in six of ten angular segments. This is not possible when either only two low-side switching elements are closed and one of them is in phase B, or the low-side switching elements in phases A and D as well as C and E are closed simultaneously, since the individual phase currents of those phases may then not be ascertained.

The method may be optimized even further by respectively switching on one additional low-side switching element for a short period of time in each case in the angular segments which are not measurable, which in the terminology of the present patent application is referred to as "setting a measuring mode of the power converter." As described above, a slightly lower torque is generated in this way; however, the loss is significantly smaller here since a switching intervention is only necessary in one phase.

TABLE 5

| A | B | C | D | E | $I_A$ | $I_B$ | $I_C$ | $I_D$ | $I_E$ |
|---|---|---|---|---|---|---|---|---|---|
| 0 | 0 | 0 | 1 | 1 | M | A, C | M | A, C | A, C |
| 0 | 0 | 1 | 1 | 1 | M | — | — | — | — |
| 0 | 0 | 1 | 1 | 0 | M | A, E | A, E | A, E | M |
| 0 | 1 | 1 | 1 | 0 | M | A, E | A, E | A, E | M |
| 0 | 1 | 1 | 0 | 0 | — | — | — | — | M |
| 1 | 1 | 1 | 0 | 0 | D, E | D, E | D, E | M | M |
| 1 | 1 | 0 | 0 | 0 | — | — | — | M | — |
| 1 | 1 | 0 | 0 | 1 | C, D | C, D | M | M | C, D |
| 1 | 0 | 0 | 0 | 1 | C, D | C, D | M | M | C, D |
| 1 | 0 | 0 | 1 | 1 | — | — | M | — | — |

What is claimed is:

1. A method for ascertaining the phase currents of an electric machine having a power converter and a stator with a phase number of at least four, the power converter including a plurality of high-side switching elements and a plurality of low-side switching elements, the method comprising:
   operating the power converter of the electric machine according to one of a pulse width modulation activation pattern and a block activation pattern, wherein each one of the pulse width modulation activation pattern and the block activation pattern includes an operating state in which at least two of the low-side switching elements are activated;
   measuring phase currents of a selected number of measuring phases during the operating state, the selected number being at least two and being lower by at least two than the phase number, wherein the measured phase currents are measured from at least two of the measuring phases associated with the activated low-side switching elements during the operating state, and wherein a remainder of the low-side switching elements that are not the activated low-side switching elements during the operating state are non-conductive while the measuring is performed; and arithmetically determining the phase currents of the remaining phases from the measured phase currents, wherein at least the measured phase currents, a spatial angle of the measuring phases and a spatial angle of the remaining phases are used for the arithmetical determination.

2. The method as recited in claim 1, wherein the spatial angle of the measuring phases and the remaining phases is determined based on a geometric arrangement of the measuring phases and the remaining phases in the electric machine.

3. The method as recited in claim 2, wherein the phase currents are measured when active switching elements assigned to the measuring phases in a low-side path of the power converter are activated.

4. The method as recited in claim 1, wherein the phase number is four, five or six.

5. The method as recited in claim 4, wherein the number of the measuring phases is two or three.

6. The method as recited in claim 1, wherein the phase currents of at least two measuring phases are measured in the form of a total current.

7. The method as recited in claim 3, wherein the method is performed in a measuring mode of the power converter in which at least one switching element of the power converter is additionally activated in comparison to a regular operating mode.

8. A system for ascertaining the phase currents of an electric machine having a power converter and a stator with a phase number of at least four, the power converter including a plurality of high-side switching elements and a plurality of low-side switching elements, the system comprising:

a control unit including a computer processor configured to perform the following:

operating the power converter of the electric machine according to one of a pulse width modulation activation pattern and a block activation pattern, wherein each one of the pulse width modulation activation pattern and the block activation pattern includes an operating state in which at least two of the low-side switching elements are activated;

measuring phase currents of a selected number of measuring phases during the operating state, the selected number being at least two and being lower by at least two than the phase number, wherein the measured phase currents are measured from at least two of the measuring phases associated with the activated low-side switching elements during the operating state, and wherein a remainder of the low-side switching elements that are not the activated low-side switching elements during the operating state are non-conductive while the measuring is performed; and arithmetically determining the phase currents of the remaining phases from the measured phase currents, wherein at least the measured phase currents, a spatial angle of the measuring phases and a spatial angle of the remaining phases are used for the arithmetical determination.

9. A non-transitory, computer-readable data storage medium storing a computer program having program codes which, when executed on a computer, perform a method for ascertaining the phase currents of an electric machine having a power converter and a stator with a phase number of at least four, the power converter including a plurality of high-side switching elements and a plurality of low-side switching elements, the method comprising:

operating the power converter of the electric machine according to one of a pulse width modulation activation pattern and a block activation pattern, wherein each one of the pulse width modulation activation pattern and the block activation pattern includes an operating state in which at least two of the low-side switching elements are activated;

measuring phase currents of a selected number of measuring phases during the operating state, the selected number being at least two and being lower by at least two than the phase number, wherein the measured phase currents are measured from at least two of the measuring phases associated with the activated low-side switching elements during the operating state, and wherein a remainder of the low-side switching elements that are not the activated low-side switching elements during the operating state are non-conductive while the measuring is performed; and arithmetically determining the phase currents of the remaining phases from the measured phase currents, wherein at least the measured phase currents, a spatial angle of the measuring phases and a spatial angle of the remaining phases are used for the arithmetical determination.

* * * * *

UNITED STATES PATENT AND TRADEMARK OFFICE
CERTIFICATE OF CORRECTION

PATENT NO. : 9,859,823 B2
APPLICATION NO. : 14/428583
DATED : January 2, 2018
INVENTOR(S) : Julian Roesner It is certified that error appears in the above-identified patent and that said Letters Patent is hereby corrected as shown below:

On the Title Page

Item (73) Assignee:
Change "Robert Bosch GmbH" to --Robert Bosch GmbH and SEG Automotive Germany GmbH--

Signed and Sealed this
Nineteenth Day of June, 2018

Andrei Iancu
*Director of the United States Patent and Trademark Office*